US010778198B2

(12) United States Patent
Chen et al.

(10) Patent No.: US 10,778,198 B2
(45) Date of Patent: Sep. 15, 2020

(54) LEVEL SHIFTER

(71) Applicant: Taiwan Semiconductor Manufacturing Company, Ltd., Hsinchu (TW)

(72) Inventors: Chien-Yuan Chen, Hsinchu (TW); Cheng Hung Lee, Hsinchu (TW); Hung-Jen Liao, Hsinchu (TW); Hau-Tai Shieh, Hsinchu (TW)

(73) Assignee: Taiwan Semiconductor Manufacturing Company, LTD (TW)

( * ) Notice: Subject to any disclaimer, the term of this patent is extended or adjusted under 35 U.S.C. 154(b) by 0 days.

(21) Appl. No.: 16/842,910

(22) Filed: Apr. 8, 2020

(65) Prior Publication Data
US 2020/0235724 A1 Jul. 23, 2020

Related U.S. Application Data

(63) Continuation of application No. 16/389,461, filed on Apr. 19, 2019, now Pat. No. 10,651,832.

(60) Provisional application No. 62/717,206, filed on Aug. 10, 2018.

(51) Int. Cl.
*H03K 3/356* (2006.01)
*G11C 11/56* (2006.01)
*H03K 17/687* (2006.01)
*H03K 19/0185* (2006.01)

(52) U.S. Cl.
CPC .... *H03K 3/356156* (2013.01); *G11C 11/5621* (2013.01); *H03K 17/6871* (2013.01); *H03K 19/018521* (2013.01)

(58) Field of Classification Search
CPC .................. H03K 3/356156; H03K 5/2481
USPC ............................................. 327/333, 50–57
See application file for complete search history.

(56) References Cited

U.S. PATENT DOCUMENTS

| 4,973,864 | A | * | 11/1990 | Nogami | G11C 7/065 327/55 |
|---|---|---|---|---|---|
| 5,345,121 | A | * | 9/1994 | Itoh | H03K 3/356069 327/208 |
| 5,506,524 | A | * | 4/1996 | Lin | G11C 7/062 327/52 |
| 5,552,728 | A | * | 9/1996 | Lin | G11C 7/065 327/51 |
| 5,903,171 | A | * | 5/1999 | Shieh | G11C 7/065 327/55 |
| 5,939,903 | A | * | 8/1999 | Lin | G11C 7/065 327/55 |

(Continued)

*Primary Examiner* — Tomi Skibinski
(74) *Attorney, Agent, or Firm* — Merchant & Gould P.C.

(57) ABSTRACT

A level shifter includes: an input terminal configured to receive an input signal in a first voltage domain; a first output terminal; a second output terminal; a first inverter configured to receive and shift the input signal to a first output signal at the first output terminal in a second voltage domain higher than the first voltage domain in response to a logical high state of an enable signal in the first voltage domain; a second inverter configured to receive and shift a complement of the input signal to a second output signal at the second output terminal in the second voltage domain in response to the logical high state; a pair of NMOS sensing transistors; a PMOS transistor configured to equalize the first output signal and the second output signal in response to a logical low state of the enable signal.

20 Claims, 11 Drawing Sheets

(56) References Cited

U.S. PATENT DOCUMENTS

| | | | | |
|---|---|---|---|---|
| 6,018,260 A * | 1/2000 | Gabara | ............... | H03M 9/00 327/201 |
| 6,351,173 B1 * | 2/2002 | Ovens | ............. | H03K 3/356156 326/81 |
| 7,772,912 B2 * | 8/2010 | Yen | ............... | H03K 3/356113 327/306 |
| 8,536,898 B2 * | 9/2013 | Rennie | ............... | G11C 11/413 327/51 |
| 2009/0051403 A1 * | 2/2009 | Shimizu | ............. | G09G 3/3685 327/333 |
| 2012/0275254 A1 * | 11/2012 | Ferrant | ............. | G11C 11/4091 365/203 |

* cited by examiner

LEVEL SHIFTER

CROSS-REFERENCE TO RELATED APPLICATION

This application is a continuation of application Ser. No. 16/389,461, filed Apr. 19, 2019, now U.S. Pat. No. 10,651,832, which application claims the benefit of provisional application Ser. No. 62/717,206, filed Aug. 10, 2018, which applications are incorporated herein by reference in their entirety.

BACKGROUND

A level shifter is a device that shifts an electronic signal from one voltage level to another voltage level. Numerous devices, such as static random-access memory (SRAM) for example, perform certain operations more efficiently and with better accuracy using specific voltage level signals. However, the voltage level of the signals inherent in these devices are not always suitable for every operation that the device performs. Employing a level shifter allows for a device to shift the voltage level of a signal to a value more appropriate to enhance the performance of a specific operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
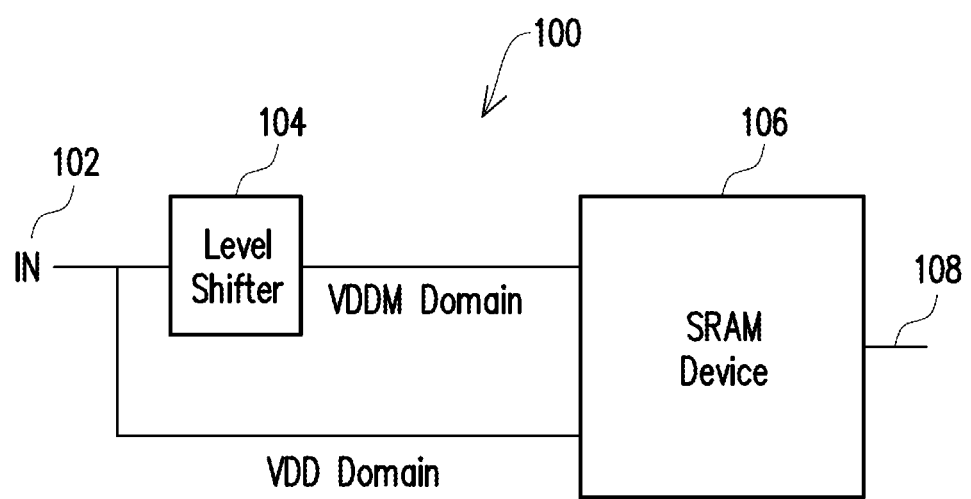
FIG. 1 is a block diagram illustrating aspects of a level shifter implemented with an SRAM device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Level shifters are used, for example, to shift an input signal in a low voltage domain into an output signal in a higher voltage domain for use by other components in a device. For example, a "dual rail" SRAM architecture refers to an SRAM arrangement where the memory logic is operated in a low voltage domain to conserve power, while the memory array is operated in the high voltage domain to improve performance. With such devices, memory leakage power may be reduced but the memory access time may be impacted. The gain in leakage power increases as the difference in the high voltage and low voltage value increases.

However, traditionally there is a supply voltage split range limitation due to a transistor of the level shifter not being able to be cut-off when certain voltage levels are present. In some disclosed embodiments, a lever shifter includes a differential sensing transistor pair by which the supply voltage split range can be enlarged. This allows the yield of the device to remain high through a larger voltage range, among other things.

FIG. 1 is a block diagram depicting an example implementation of a level shifter system 100 including a level shifter 104 coupled to an SRAM device 106 in accordance with some embodiments. While the SRAM device 106 is shown coupled to the level shifter 104 in the example of FIG. 1, any device requiring a level shifter could be employed and is within the scope of this disclosure. In the example shown, an input signal IN is received on an input terminal 102 and passed to the level shifter 104 and the SRAM device 106. The received input signal IN is in a first, or VDD voltage domain. The level shifter 104 takes the input signal IN and shifts it from the VDD domain to a second voltage domain, the VDDM domain. The output signal from the level shifter 104 in the VDDM domain is used by the SRAM device 106 to optimize the operation of the SRAM device 106. By utilizing signals in both the VDD and VDDM domains, the SRAM device performance, such as the memory access speed, is increased while the power consumption is minimized.

Figure 2:
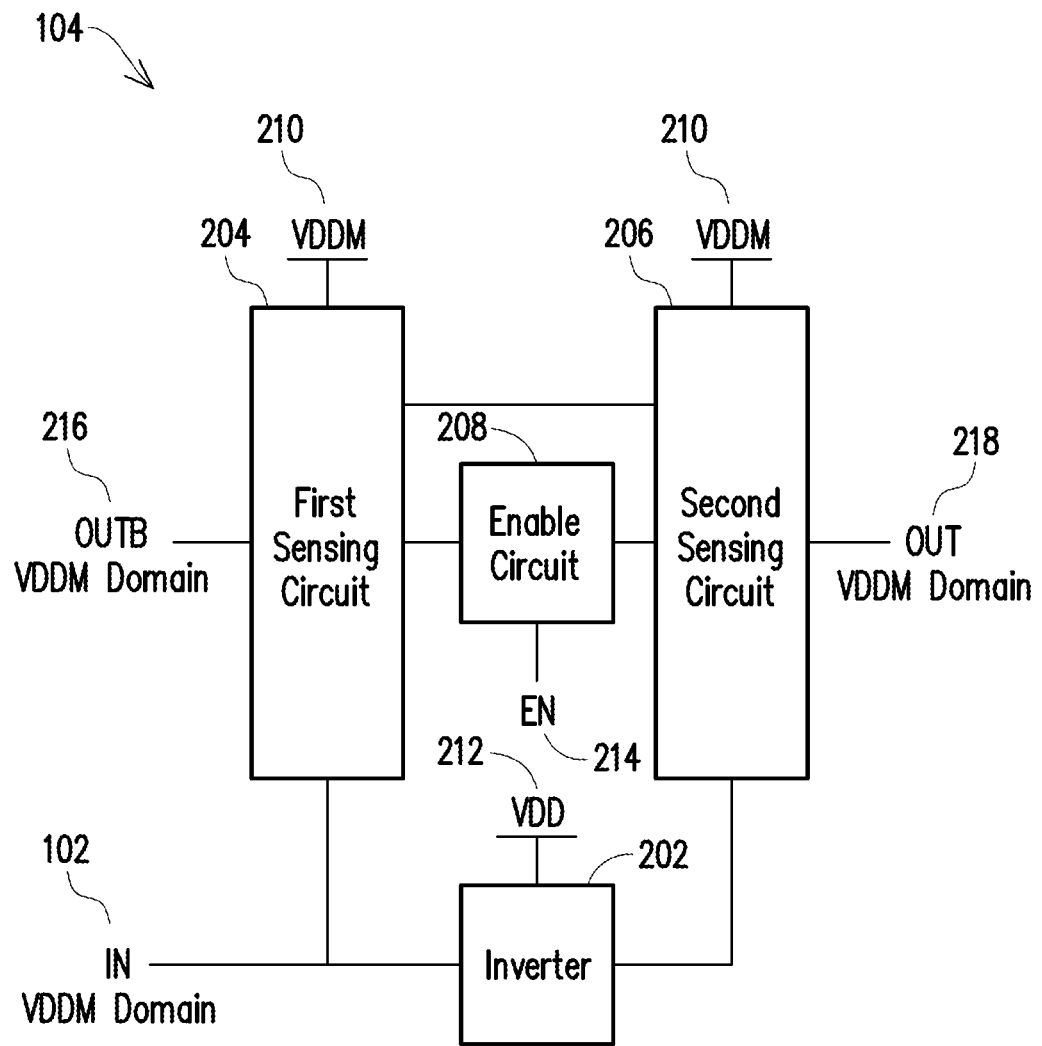
FIG. 2 is a block diagram illustrating aspects of a level shifter in accordance with some embodiments.

FIG. 2 is a block diagram showing aspects of an example of the level shifter 104 in accordance with some embodiments. The level shifter 104 is configured to receive an input signal IN at the input terminal 102 in a first voltage domain (VDD) and output an output signal OUT and its complement OUTB in a second voltage domain (VDDM) at first and second output terminals 216, 218.

A first sensing circuit 204 is connected to the input terminal 102 and the first and second output terminals 216, 218. The first sensing circuit 204 is configured to shift the input signal IN from the first voltage domain (VDD) to the second voltage domain (VDDM). A second sensing circuit 206 is also connected to the first and second output terminals 216, 218 and is configured to receive an input bar signal INB 322 (complement of the input signal IN), which is also in the VDD domain. A first inverter 202 is connected to the input terminal 102 and is configured to output the complement of the input signal IN as the input bar signal INB 322. The first and second sensing circuits 204, 206 are connected to a voltage supply terminal 210 configured to receive an input voltage VDDM in the second voltage domain. As noted previously, the first inverter 202 operates in the VDD domain and is thus connected to a voltage supply terminal 212 configured to receive the VDD input voltage.

As discussed further herein below, the first and second sensing circuits 204, 206 are additionally cross-coupled—the first output terminal 216 of the first sensing circuit 204 is connected to an input of the second sensing circuit 206, and the second output terminal 218 of the second sensing circuit 206 is connected to an input of the first sensing circuit 204. The first and second sensing circuits 204, 206 are configured to shift the input signal from the first VDD domain to the VDDM voltage domain.

An enable circuit 208 is connected between the first sensing circuit 204 and the second sensing circuit 206. The enable circuit 208 includes an enable terminal 214 configured to receive an enable signal EN. In some embodiments the enable signal EN is a clock pulse. The enable circuit 208 is configured to equalize the voltage level of the first and second output signals OUTB, OUT at the respective first and second output terminals 216, 218. In some examples the enable circuit 204 equalizes the output signals OUTB, OUT to a predetermined voltage level. One example predetermined voltage level is one half the value of the second input voltage, VDDM. Additionally, in response to the enable and input signals, the level shifter 104 circuit is further configured to output complementary output signals (216, 218) in the second voltage domain (VDDM) at the first and second output terminals.

Figure 3:
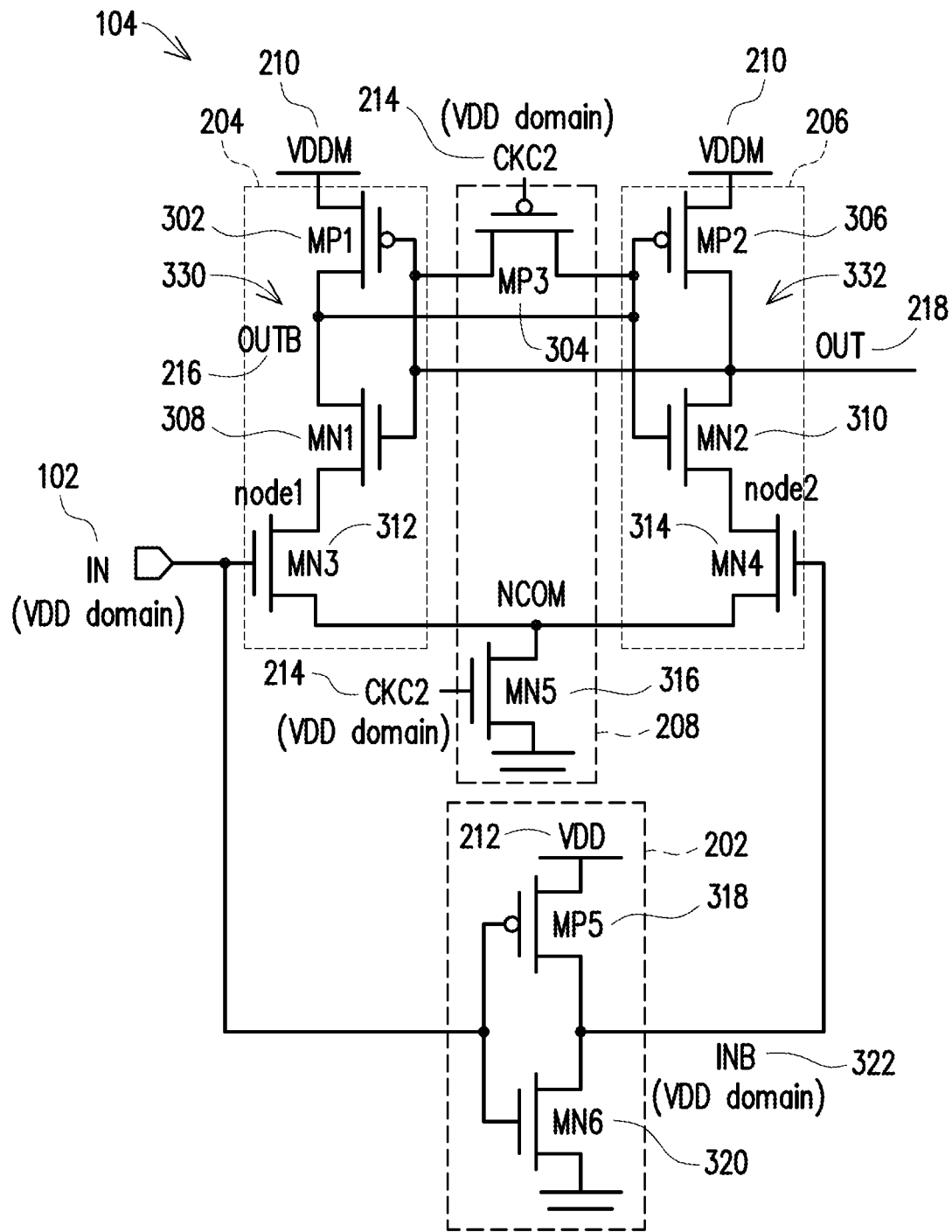
FIG. 3 is a circuit diagram of a level shifter in accordance with some embodiments.

FIG. 3 is a circuit diagram showing further details of an example of the level shifter 104 described in FIG. 2. The first inverter 202 is comprised of a PMOS transistor 318 and an NMOS transistor 320. The first sensing circuit 204 includes a second inverter 330 comprised of a PMOS transistor 302 and an NMOS transistor 308 coupled to a first NMOS sensing transistor 312. The gate of the first sensing transistor 312 is coupled to the input terminal 102 and is thus configured to receive the input signal IN.

The second sensing circuit 206 includes a third inverter 332 comprised of a PMOS transistor 306 and an NMOS transistor 310 coupled to a second NMOS sensing transistor 314. The gate of the second sensing transistor 314 is configured to receive the complementary input signal INB 322 provided by the first inverter 202. The first and second sensing transistors 312, 314 thus form a differential sensing transistor pair.

The enable circuit 208 includes a PMOS transistor 304 coupled between the first and second outputs 216, 218. The gate terminal 214 of the transistor 304 is connected to receive an enable signal, which in the illustrated example is a clock pulse CKC2 in the VDD domain. Additionally, the enable circuit 208 includes an NMOS transistor 316 having a gate terminal 214 connected to receive the enable signal, or clock pulse CKC2.

When the enable signal CKC2 is low, the VDD voltage at the gate of the transistor 304 turns the transistor 304 at least partially on, which couples the gates of the transistors 302, 306, 308, and 310 together, as well as the output terminals 216,218. The low enable signal CKC2 also turns the transistor 316 off, isolating the common source sensing transistors 312, 314 from ground. Accordingly, the signals at the first and second output terminals 216, 218 are equalized between VDDM and ground, or about half of VDDM. Thus, as used herein, equalizing the output signals OUT, OUTB refers to setting the output signals OUT, OUTB at approximately the same voltage level (i.e. ±10%) at about half the VDDM voltage level based on the operation of the transistors 304 and 316 of the equalization circuit 208 in response to the enable signal CKC2.

When the enable signal CKC2 is high the transistor 304 turns off, decoupling the gates of transistors 302, 306, 308, and 310 from one another, and decoupling the output terminals 216 and 218 from one another. Further, the high CKC2 signal connects a common node NCOM between the transistors 312, 314 to ground. The first and second sensing circuits 204, 206 are then able to sense the input signal IN received at the input terminal 102. Thus, a high input signal IN (in the VDD domain) turns on the sensing transistor 312, pulling the output signal OUTB low. The high input signal IN is further inverted by the first inverter 202 and received as a low second input INB 322 by the gate of the sensing transistor 314. The low INB 322 signal turns off sensing transistor 314, pulling the output signal OUT to the VDDM level through the transistors 306, 310. If the first input signal IN is low while the enable signal CKC2 is high, the first sensing transistor 312 is turned off, which pulls the output signal OUTB high at the VDDM level. The inverted input signal INB 322 turns on the sensing transistor 314, pulling the output signal OUT at the output terminal 218 low.

Figure 4A:
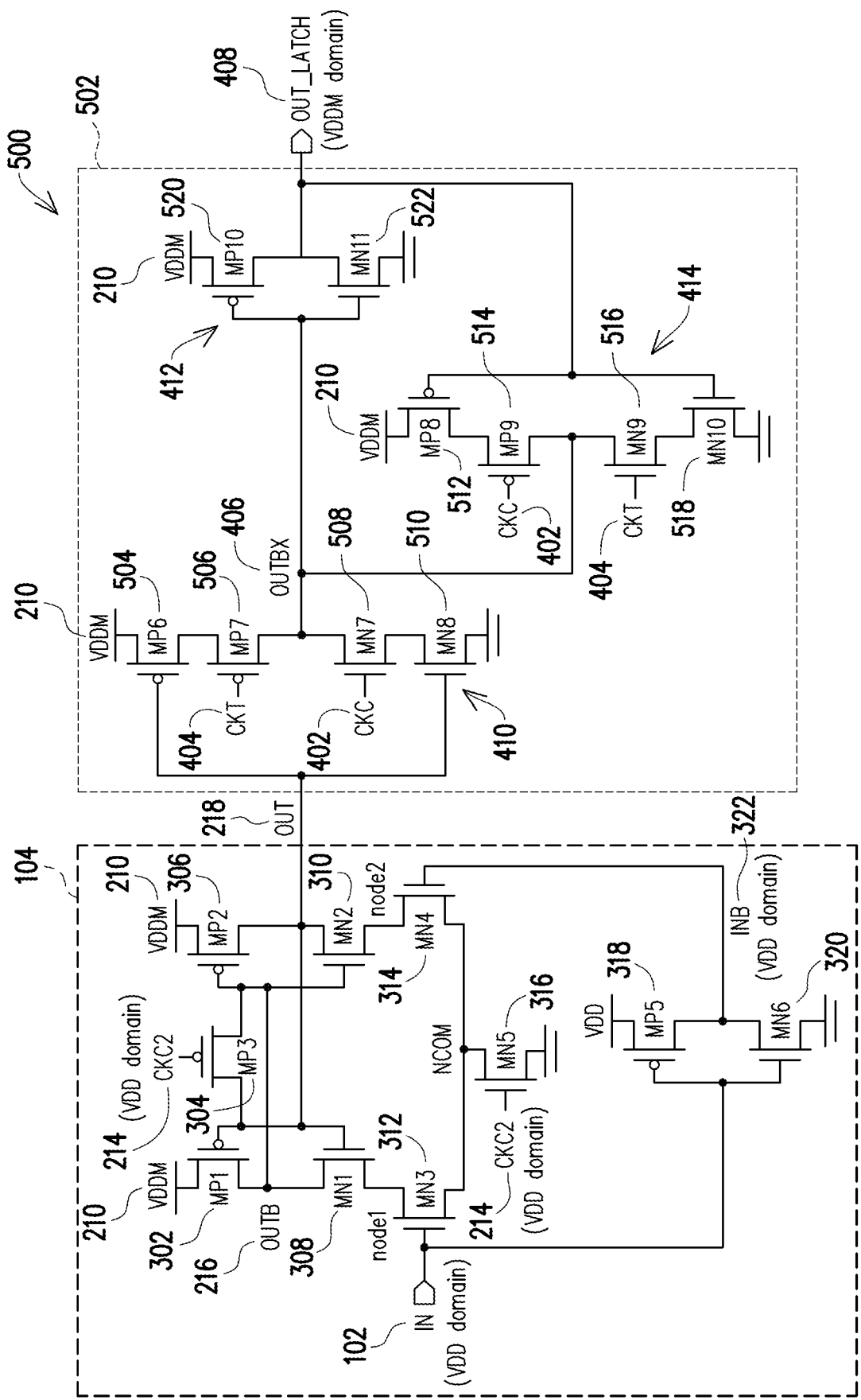
FIG. 4A is a circuit diagram of a level shifter system in accordance with some embodiments.

FIG. 4A illustrates an example level shifter system 500, where the level shifter 104 has its output terminal 218 coupled to an output latch 502 that operates in the VDDM domain. The output latch 502 is coupled to the output terminal 218 of the level shifter 104 to receive the output signal OUT from the level shifter 104 in the VDDM domain, and latches the output signal while the output signals OUT, OUTB are equalized as disclosed above, among other things.

The latch 502 is coupled to the VDDM voltage terminal 210 and thus operates in the VDDM domain. The latch 502 further includes clock terminals 402 and 404 that receive complementary clock signals CKC and CKT, as well as an output terminal 408 that provides the latch output signal OUT_LATCH. The latch is configured to latch the output signal OUT provided by the level shifter 104 in the VDDM voltage domain in response to the clock signal CKC and its complement CKT. In some examples, the clock signal CKC and the enable signal CKC2 are operated in phase with one another, though in the illustrated embodiment the enable signal CKC2 is in the VDD domain, while the latch clock signal CKC is in the VDDM domain. In other examples, the level shifter 104 and the latch 502 could share a common clock signal in the VDDM domain.

The latch 502 includes a first tri-state inverter 410 configured to invert the output signal OUT from the level shifter 104 in response to the clock signals CKC, CKT. The inverted output signal OUTBX is provided at an output node 406 of the tri-state inverter 410. The first tri-state inverter 410 includes PMOS transistors 504 and 506, and NMOS transistors 508 and 510 connected in series between the VDDM voltage terminal 210 and ground. The gate terminals of the transistors 504 and 510 are connected to receive the output signal OUT from the level shifter output terminal 218, while the gate terminals of the transistors 506 and 508 are connected to receive the clock signals CKT and CKC, respectively. The first tri-state inverter 410 provides the latch output bar signal OUTBX, which is received by an inverter 412 configured to reinvert the OUTBX signal from the first tri-state inverter. The second inverter includes a PMOS transistor 520 and an NMOS transistor 522 connected in series between the VDDM voltage terminal 210 ground. A second tri-state inverter 414 includes PMOS transistors 512 and 514, and NMOS transistors 516 and 518 connected in series between the VDDM voltage terminal 210 and ground. The gate terminals of the transistors 514 and 516 are connected to receive the clock signals CKC and CKT 404, respectively, while the gate terminals of the transistors 512 and 518 receive the output of the inverter 412 to latch the OUTBX signal in response to the clock signals CKC and CKT.

Figure 4B:
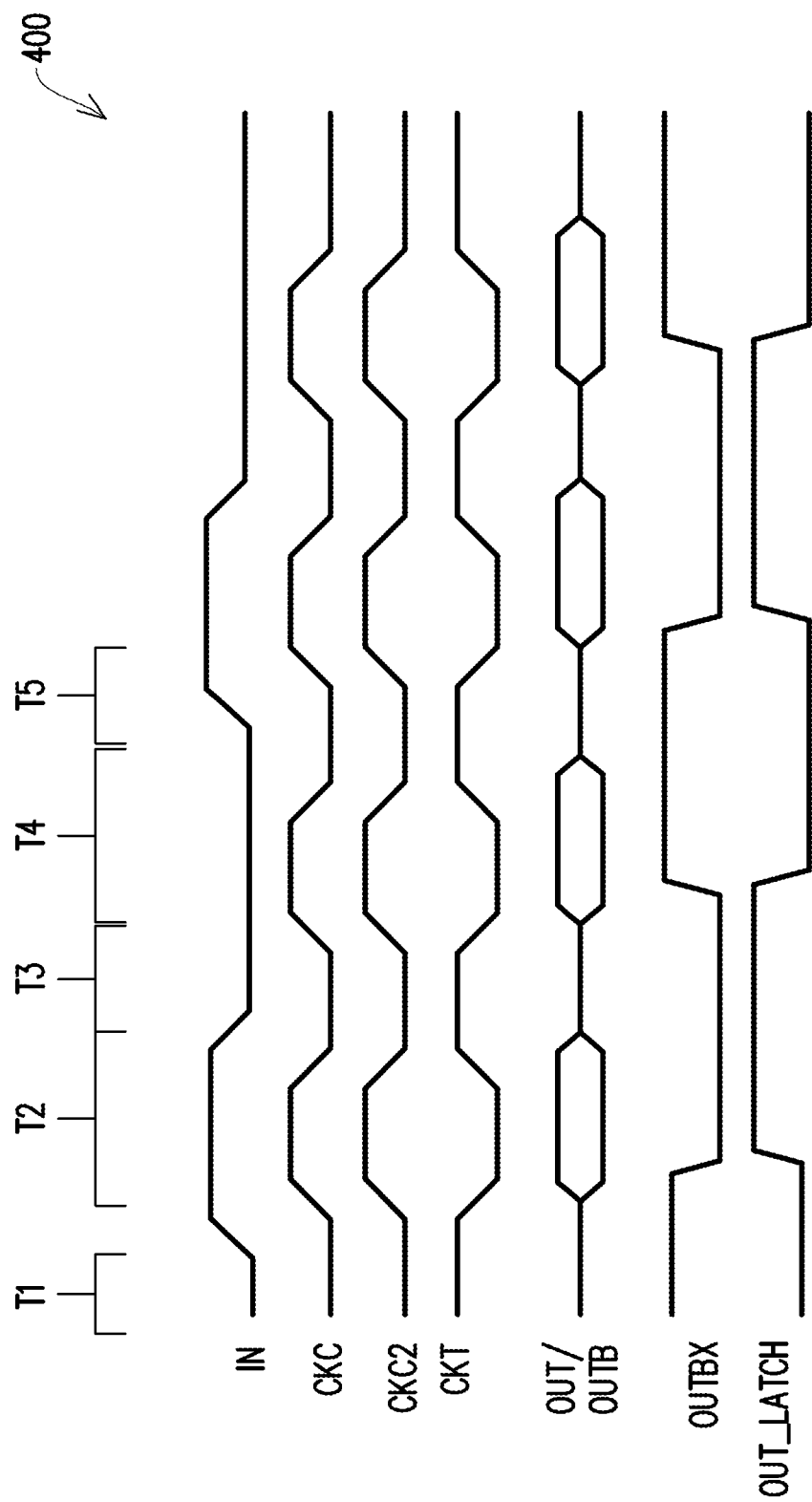
FIG. 4B is a timing diagram illustrating example signals of a level shifter system in accordance with some embodiments.

FIG. 4B is a timing diagram, showing example signals of the level shifter 104 and latch 502 in accordance with the example embodiments. FIGS. 5A-E illustrate examples of the operation of the level shifter system 500 based on signals shown in the timing diagram of FIG. 4B.

Figure 5A:
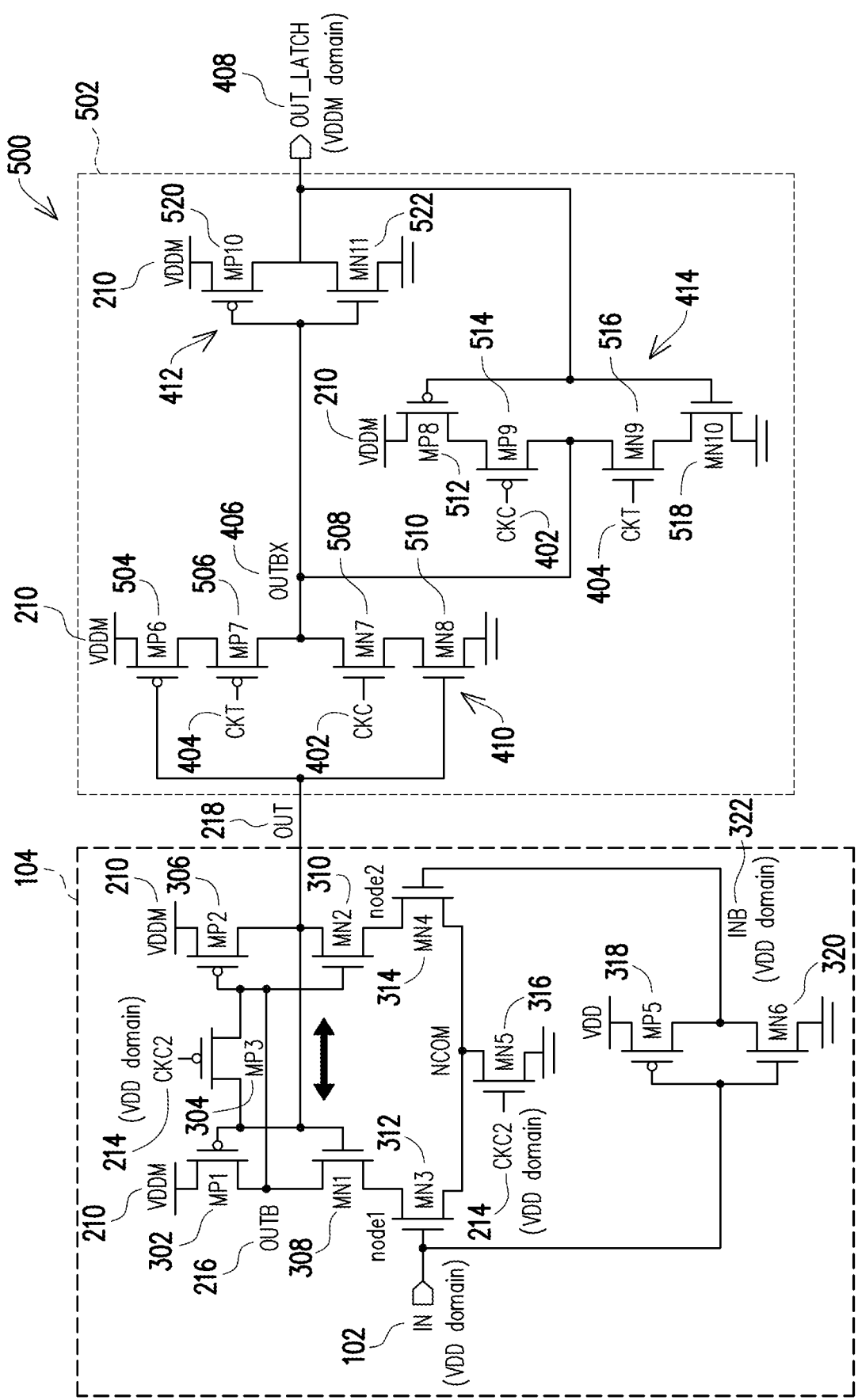
FIGS. 5A-E illustrate operation of the example level shifter system shown in FIG. 4A in accordance with the timing diagram of FIG. 4B.

During a first time period T1, the level shifter output signals OUT, OUTB are equalized to a predetermined voltage level, such as half of VDDM as discussed herein above. FIG. 5A illustrates an example of the level shifter system 500 operation during the first time period T1. As noted above, during the first time period T1, the enable signal CKC2 is low to equalize the output signals OUT, OUTB of the level shifter 104 as indicated by the arrows between the inverters 330, 332. The low enable signal CKC2 at least partially turns on the transistor 304 and turns off the transistor 316, equalizing the output signals OUT, OUTB at about half the value of VDDM. Thus, as used herein, equalizing the output signals OUT, OUTB refers to setting the output signals OUT, OUTB at approximately the same voltage levels (i.e. ±10%) at about half the VDDM voltage level based on the operation of the transistors 304 and 316 of the equalization circuit 208 in response to the enable signal CKC2.

Figure 5B:
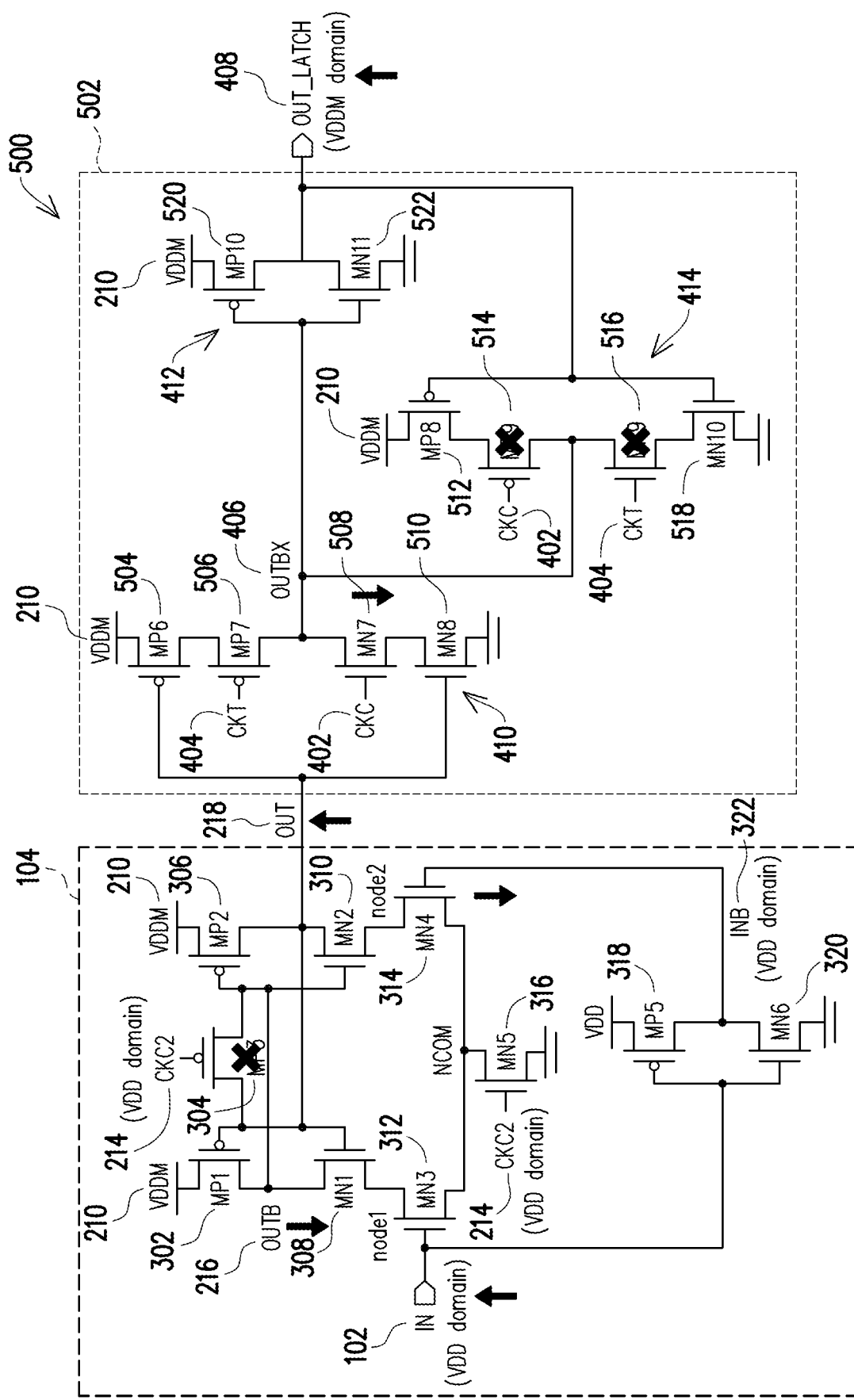

During a second time period T2, the level shifter enable signal CKC2 goes high. As noted previously, in the illustrated examples the enable signal CKC2 is in phase with the latch clock signal CKC, which accordingly also goes high during the second time period T2 while the complement latch clock signal CKT goes low. The input signal IN at the level shifter input terminal 102 goes high during the second time period T2. FIG. 5B shows operation of the system 500 during the second time period T2. The high enable signal CKC2 turns off the transistor 304 and turns on the transistor 316, which provides a path to ground from the sensing transistors 312, 314. Since the input signal IN is high, the first sensing transistor 312 turns on, which in turn pulls down the output OUTB from its equalized state to a low value (ground). Additionally, the inverted input signal INB 322 turns the second sensing transistor 314 off, pulling the output signal OUT from its equalized state to a high value (VDDM). Thus the input signal IN voltage level was shifted from the VDD domain to the VDDM domain.

Additionally, the latch clock signals CKT and CKC turn on the first tri-state inverter 410 and turn off the second tri-state inverter 414. The high output signal OUT is inverted by the first tri-state inverter 410 of the latch 502 to produce a low OUTBX signal at the node 406 which is fed through and output by the inverter 412 as the high latch output OUT_LATCH.

Figure 5C:
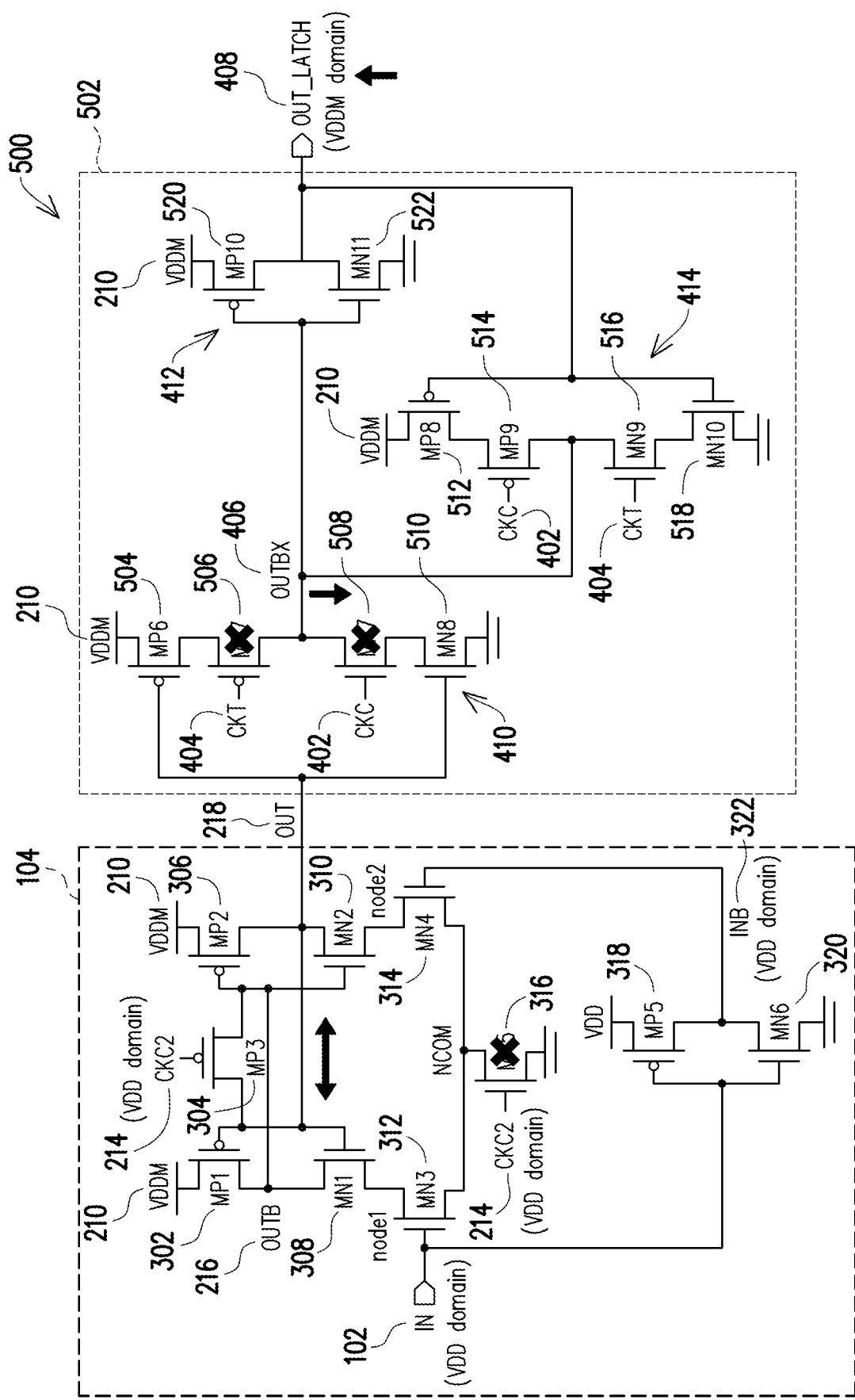

Referring back to FIG. 4B, during a third time period T3, the enable signal CKC2 and the latch clock signal CKC go low. The latch complement clock signal CKT accordingly goes high. As shown in FIG. 5C, the latch clock signals CKC, CKT turn off the first tri-state inverter 410 and turn on the second tri-state inverter, cutting off the latch feedthrough path and activating a feedback path through the second tri-state inverter 414. This latches the high latch output signal OUT_LATCH while the level shifter output signals OUT, OUTB are equalized in response to the low enable signal CKC2. The level shifter 104 thus returns to a similar state as that shown in FIG. 5A, where the output signals OUT and OUTB are equalized to prepare for the next cycle.

Figure 5D:
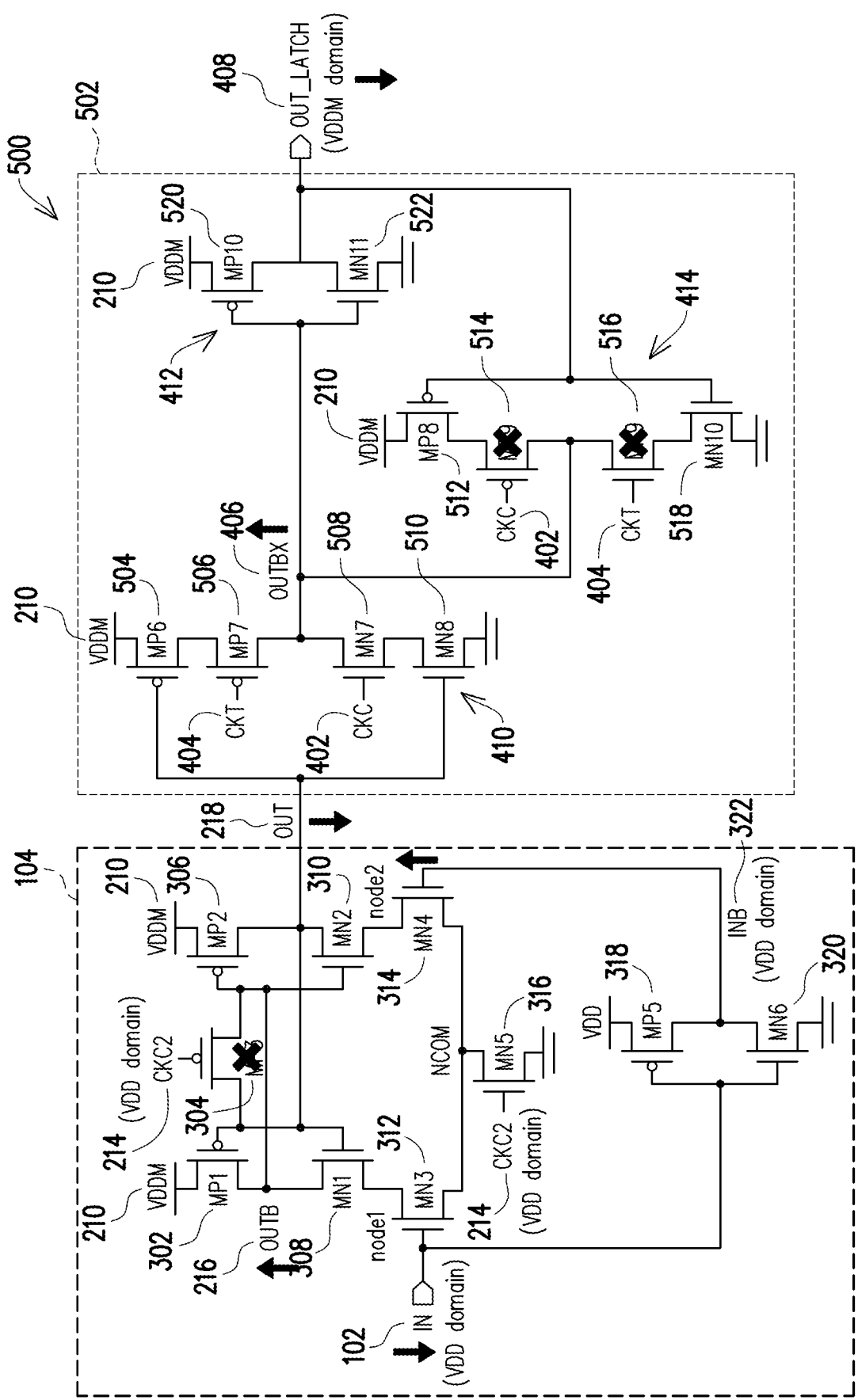

In a fourth time period T4 shown in FIG. 4B, the latch clock signal CKC and the enable signal CKC2 have cycled to low, while the complement latch clock signal CKT has cycled to high. The input signal IN in the VDD domain remains low in the fourth time period T4. FIG. 5D illustrates operation of the level shifter system 500 during the fourth time period T4, in which the high enable signal CKC2 turns the transistor 316 on, and turns the transistor 304 off. In the latch 502, the clock signals CKC and CKT turn on transistors 506 and 508 and turn off transistors 514 and 516. The input signal IN is low, thus the inverted input signal INB 322 turns on the sensing transistor 314 and pulls the output signal OUT at the output terminal 218 to a low state (ground) from its equalized state of time period T3. Since the input signal IN is low, the sensing transistor 312 is off allowing the output signal OUTB at the output terminal 216 to be pulled up from its equalized state to high (VDDM). Since the first tri-state inverter 410 is on while the second tri-state inverter 414 is in a high impedance state, the feedthrough path of the latch 502 is active. This allows for the first tri-state inverter to invert the level shifter output signal OUT to produce a high OUTBX signal at the node 406, which is then inverted by the inverter 412 and output at the latch output terminal 408 as a low output signal OUT_LATCH.

Figure 5E:
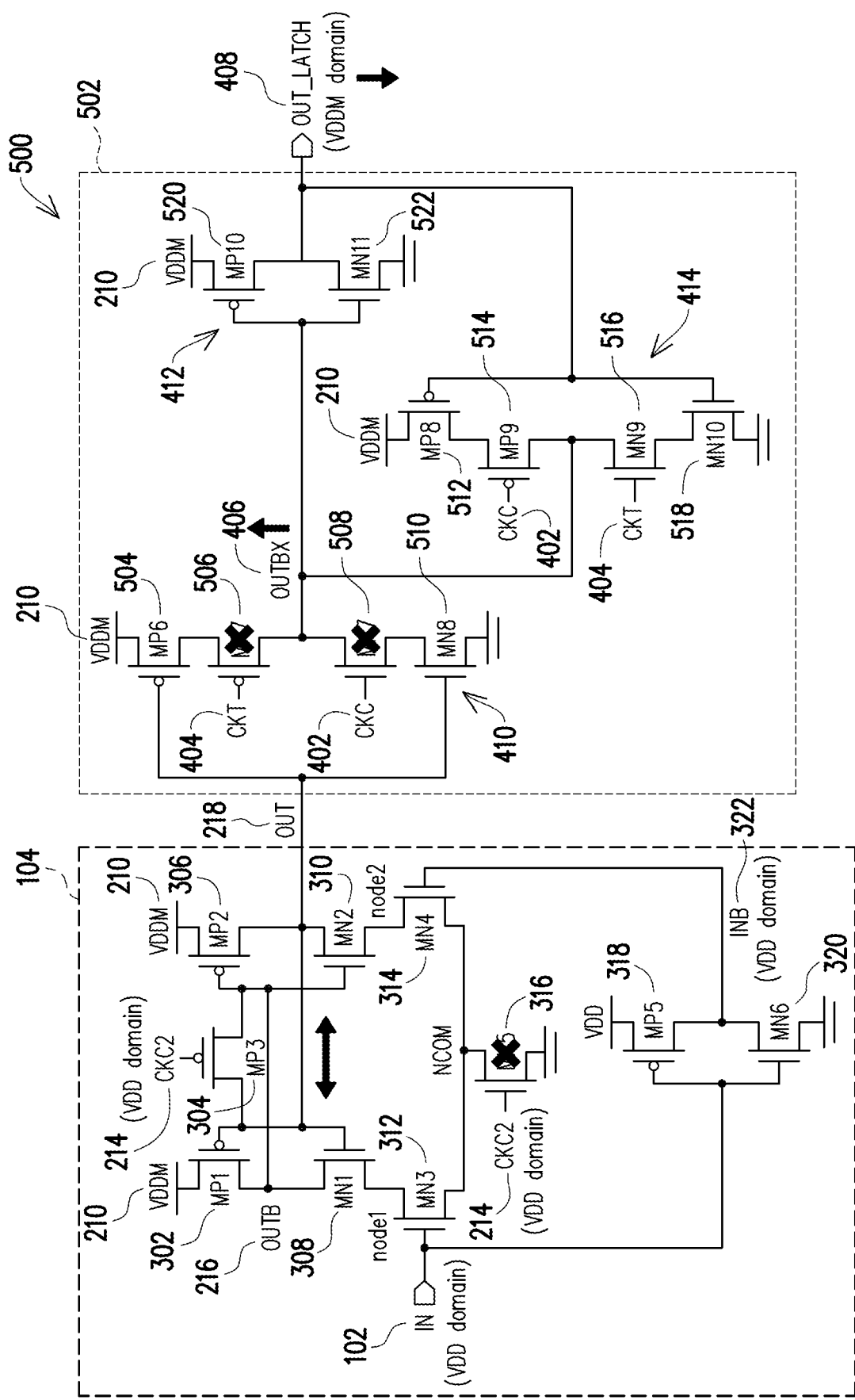

FIG. 4B further illustrates a fifth time period T5, in which the latch output signal OUT_LATCH is latched and the level shifter outputs OUT and OUTB are again equalized in preparation for the next cycle. FIG. 5E shows operation of the system 500 for the fifth time period T5 418. In this time period the latch clock signal CKC and the enable signal CKC2 go low, and the latch complement clock signal CKT goes high. These signals turn on transistors 304, 514 and 516, and turn off transistors 316, 506 and 508. The level shifter 104 is thus in a similar state as that shown in FIG. 5A, where the output signals OUTB and OUT are equalized to prepare for the next cycle. With the first tri-state inverter 410 moving to a high impedance state and the second tri-state inverter 414 moving to an active state, the feedthrough path is cut while the feedback path is activated. This latches the current signal LATCH_OUT at the latch output terminal 408.

Figure 6:
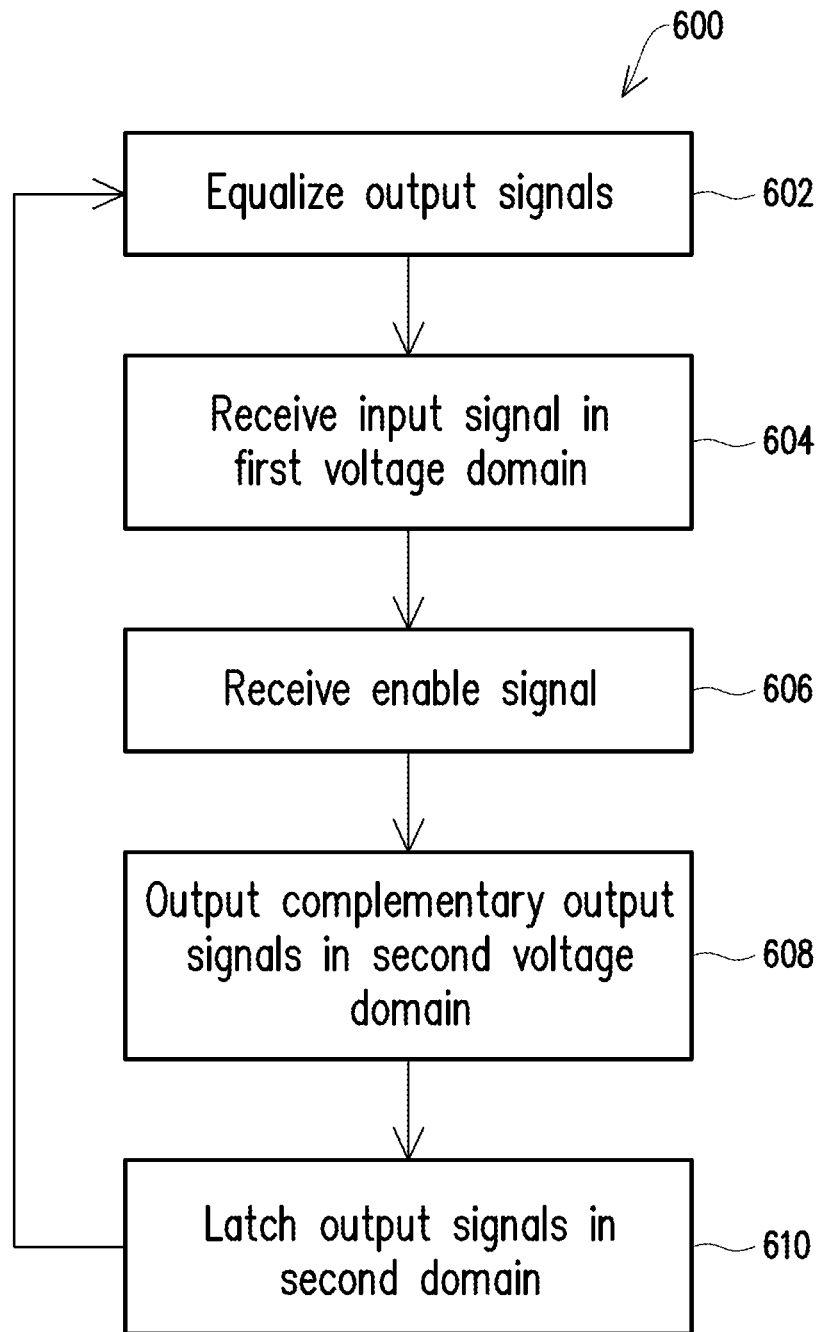
FIG. 6 is a flow-chart showing a level shifting method in accordance with some embodiments.

FIG. 6 is a flow-chart showing an example of a method 600 of level shifting in accordance with the example embodiments. The method 600 begins at operation 602 where the level shifter 104 equalizes outputs signals of the level shifter at a predetermined initial voltage level at first and second output terminals 216, 218. At an operation 604, the level shifter 104 receives an input signal IN 102 in a first voltage domain on an input terminal. The level shifter 104 then receives an enable signal such as the CKC2 signal at operation 606, which enables the level shifter 104 to shift the level of the input signal IN 102 from the VDD domain into the VDDM domain. More specifically, the output terminals are shifted from the equalized voltage levels (about half of VDDM, for example) to complementary output signals OUT, OUTB in a second voltage domain VDDM, which is higher than the first voltage domain based on the input signal IN and the enable signal CKC2.

As shown in FIG. 4B and FIGS. 5A-E, in some embodiments the output signal from the level shifter 104 is latched in the VDDM domain.

Known level shifters often are limited as to the difference between the voltage range of the VDDM and VDD voltage domains. Some disclosed embodiments may provide a larger supply voltage split range between the first and second voltage domains. For instance, in some disclosed embodiments, the VDD voltage range is determined based on the threshold voltage Vt of the sensing transistors 312, 314. For a VDDM voltage range of 0 to 1.0 volts, some embodiments employ a VDD voltage range of 0 to less than 0.4 volts. Thus, some embodiments may employ a VDD voltage less than 40% of the VDDM voltage.

Disclosed embodiments thus include a level shifter that is configured to receive an input signal in a first voltage domain and output an output signal in a second voltage domain. The level shifter includes an input terminal configured to receive an input signal in a first voltage domain, a first output terminal, and a second output terminal. A first sensing circuit is configured to shift the input signal from the first voltage domain to the second voltage domain, and a second sensing circuit is configured to shift the input signal from the first voltage domain to the second voltage domain. An enable circuit is configured to equalize a voltage level of first and second output signals at the respective first and second output terminals in response to an enable signal. The first and second sensing circuits are configured output complementary output signals in the second voltage domain at the first and second output terminals in response to the enable signal and the input signal.

Further embodiments include a level shifting method in which output signals are equalized at first and second output terminals of a level shifter. An input signal in a first voltage domain is received on an input terminal, and an enable signal is received. Complementary first and second output signals are output in a second voltage domain higher than the first voltage domain at the first and second output terminals based on the input signal and the enable signal.

In accordance with still further embodiments, a level shifting system includes an input terminal configured to receive an input signal in a first voltage domain, and a clock terminal configured to receive a clock signal having first and second states. A level shifter is coupled to the input terminal and is configured to equalize first and second output signals in response to the first clock signal state, and to output an output signal in a second voltage domain higher than the first voltage domain in response to the input signal and the second clock signal state. A latch is configured to latch the output signal from the level shifter in the second domain in response to the clock signal first state.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A level shifter comprising:
an input terminal configured to receive an input signal in a first voltage domain;
a first output terminal;
a second output terminal;
a first inverter configured to receive the input signal and shift the input signal from the first voltage domain to a first output signal at the first output terminal in a second voltage domain higher than the first voltage domain in response to a logical high state of an enable signal in the first voltage domain;
a second inverter configured to receive a complement of the input signal and shift the complement of the input signal from the first voltage domain to a second output signal at the second output terminal in the second voltage domain in response to the logical high state of the enable signal;
a pair of NMOS sensing transistors including a first NMOS sensing transistor and a second NMOS sensing transistor having a common source terminal, wherein a drain terminal of the first NMOS sensing transistor is coupled to the first inverter, a gate terminal of the first NMOS sensing transistor is the input terminal, a drain terminal of the second NMOS sensing transistor is coupled to the second inverter, and a gate terminal of the second NMOS sensing transistor is configured to receive the complement of the input signal;
a PMOS transistor coupled between the first output terminal and the second output terminal and having a gate terminal connected to receive the enable signal in the first voltage domain, the PMOS transistor configured to equalize the first output signal and the second output signal in response to a logical low state of the enable signal.

2. The level shifter of claim 1, wherein the PMOS transistor is configured to equalize the first output signal and the second output signal to a predetermined voltage level.

3. The level shifter of claim 2, wherein the predetermined voltage level is half of a second input voltage in the second voltage domain.

4. The level shifter of claim 1, further comprising a third inverter operating in the first voltage domain and configured to create the complement of the input signal.

5. The level shifter of claim 1, wherein the enable signal is a clock pulse.

6. The level shifter of claim 1, wherein a level of the first voltage domain is less than 40% of a level of the second voltage domain.

7. A level shifting system, comprising:
an input terminal configured to receive an input signal in a first voltage domain;
a first clock terminal configured to receive a first clock signal having a logic low state and a logic high state in the first voltage domain;
a first output terminal;
a second output terminal;
a first inverter configured to receive the input signal and shift the input signal from the first voltage domain to a first output signal at the first output terminal in a second voltage domain higher than the first voltage domain in response to the logical high state of the first clock signal;
a second inverter configured to receive a complement of the input signal and shift the complement of the input signal from the first voltage domain to a second output signal at the second output terminal in the second voltage domain in response to the logical high state of the first clock signal;

a pair of NMOS sensing transistors including a first NMOS sensing transistor and a second NMOS sensing transistor having a common source terminal, wherein a drain terminal of the first NMOS sensing transistor is coupled to the first inverter, a gate terminal of the first NMOS sensing transistor is the input terminal, a drain terminal of the second NMOS sensing transistor is coupled to the second inverter, and a gate terminal of the second NMOS sensing transistor is configured to receive the complement of the input signal;

a PMOS transistor coupled between the first output terminal and the second output terminal and having a gate terminal connected to receive the first clock signal in the first voltage domain, the PMOS transistor configured to equalize the first output signal and the second output signal in response to the logical low state of the first clock signal; and a latch circuit having a second clock terminal configured to receive a second clock signal, the latch circuit configured to latch the second output signal in the second voltage domain in response to the second clock signal, wherein the second clock signal and the first clock signal are in phase with one another.

8. The system of claim 7, wherein the PMOS transistor is configured to equalize the first output signal and the second output signal to a predetermined voltage level.

9. The system of claim 8, wherein the predetermined voltage level is half of a second input voltage in the second voltage domain.

10. The system of claim 7, further comprising a third inverter operating in the first voltage domain and configured to create the complement of the input signal.

11. The system of claim 7, wherein a level of the first voltage domain is less than 40% of a level of the second voltage domain.

12. The system of claim 7, wherein the latch circuit latches the second output signal when the first clock signal is in the logical low state.

13. The system of claim 7, wherein the latch circuit comprising:

a first tri-state inverter configured to invert the second output signal in the second voltage domain in response to the second clock signal;

a fourth inverter coupled between the first tri-state inverter and a latch circuit output terminal and configured to reinvert the inverted second output signal in the second voltage domain; and a second tri-state inverter coupled between the first tri-state inverter and the latch circuit output terminal and configured to bypass the fourth inverter in response to the second clock signal.

14. The system of claim 13, wherein when the second clock signal is at a logic low state of the second clock signal, the first tri-state inverter inverts the second output signal in the second voltage domain and the second tri-state inverter is turned off.

15. The system of claim 13, wherein when the second clock signal is at a logic high state of the second clock signal, the first tri-state inverter latches the second output signal in the second voltage domain and the second tri-state inverter is turned on to bypass the fourth inverter.

16. A level shifting method, comprising:

receiving an enable signal having a logic high state and a logic low state in a first voltage domain;

equalizing a first output signal at a first output terminal and a second output signal at a second output terminal in response to the logic low state of the enable signal, the first output signal and the second output signal being in a second voltage domain higher than the first voltage domain;

receiving an input signal in the first voltage domain at an input terminal; and outputting the first output signal at the first output terminal and second output signal at the second output terminal based on the input signal and a complement of the input signal respectively in response to the logic high state of the enable signal.

17. The level shifting method of claim 16, further comprising:

latching the second output signal in the second voltage domain in response to a clock signal, wherein the enable signal and the clock signal are in phase with one another.

18. The level shifting method of claim 16, further comprising:

connecting the first output terminal and the second output terminal through a PMOS transistor, the PMOS transistor having a gate terminal connected to receive the enable signal.

19. The level shifting method of claim 16, further comprising:

inverting the input signal to the first output signal; and
inverting the complement of the input signal to the second output signal.

20. The method of claim 16, wherein the clock signal is in the second voltage domain.

* * * * *